United States Patent [19]
Bednarz et al.

[11] Patent Number: 6,152,281
[45] Date of Patent: Nov. 28, 2000

[54] MAGNETIC BULK FEEDER FOR ELECTRONIC COMPONENTS

[75] Inventors: Michael Bednarz, Canton; Lawrence Leroy Kneisel, Novi; Jay DeAvis Baker, W. Bloomfield; Hsin-Hong Huang, West Bloomfield, all of Mich.

[73] Assignee: Ford Motor Company, Dearborn, Mich.

[21] Appl. No.: 09/149,071

[22] Filed: Sep. 4, 1998

[51] Int. Cl.[7] ................................................. B65G 47/24
[52] U.S. Cl. .................. 198/381; 198/803.16; 198/658; 221/212
[58] Field of Search ............................... 198/381, 803.16, 198/658, 443; 221/203, 212, 167; 29/744, 810

[56] References Cited

U.S. PATENT DOCUMENTS

| | | | |
|---|---|---|---|
| Re. 35,914 | 10/1998 | Aoyama | 221/212 |
| 2,822,076 | 2/1958 | Baier | 198/658 |
| 2,823,781 | 2/1958 | Bosch | 198/381 |
| 3,480,165 | 11/1969 | Hurst et al. | |
| 4,113,142 | 9/1978 | Ryzhov | 198/381 |
| 4,209,959 | 7/1980 | Bachman et al. | 198/381 |
| 4,501,064 | 2/1985 | DiNozzi et al. | |
| 4,623,057 | 11/1986 | Lagenberg | 198/381 |
| 4,801,044 | 1/1989 | Kubota et al. | 221/197 |
| 4,846,345 | 7/1989 | Hamuro et al. | |
| 4,960,195 | 10/1990 | Yamaguchi et al. | |
| 4,979,640 | 12/1990 | Konishi et al. | |
| 4,984,678 | 1/1991 | Fauchard | 198/443 |
| 5,012,913 | 5/1991 | Kramer | 198/443 |
| 5,070,988 | 12/1991 | Konishi et al. | 198/380 |
| 5,074,742 | 12/1991 | Aoyama | 221/212 |
| 5,353,914 | 10/1994 | Stephen et al. | 198/392 |
| 5,355,577 | 10/1994 | Cohn | |
| 5,513,739 | 5/1996 | Berg | |
| 5,557,841 | 9/1996 | Aoyama et al. | 29/743 |
| 5,649,356 | 7/1997 | Gieskes | |
| 5,765,676 | 6/1998 | Kalm | 198/443 |

Primary Examiner—Douglas Hess
Attorney, Agent, or Firm—Leslie C. Hodges

[57] ABSTRACT

There is disclosed herein an apparatus for bulk-feeding electronic components which utilizes magnetic force and a rotating feeder tube to properly orient the components for presentment to an automated pick-and-place machine. The apparatus comprises: (1) a generally straight tube 10 having a raised end 12, a lowered end 14, a longitudinal axis L—L, and a generally cylindrical interior passage 16 therethrough; (2) a generally straight bar magnet 20 arranged beneath and proximate the tube 10, wherein the bar magnet has a North pole-South pole axis N-S oriented generally parallel with the tube longitudinal axis L—L; (3) a receptacle 30 having first and second ends 32/34 and a tapered throat 36 running therethrough, wherein the throat extends from an enlarged inlet 38 defined in the first end to a constricted outlet 39 defined in the second end, the receptacle being disposed such that the inlet is elevated above the outlet, the second end 34 of the receptacle being disposed in rotatably slidable contact with the raised end 12 of the tube such that the constricted outlet 39 is placed in communication with the tube interior passage 16 thereat; and (4) a mechanism 40 for rotating the tube 10 about its longitudinal axis L—L.

20 Claims, 3 Drawing Sheets

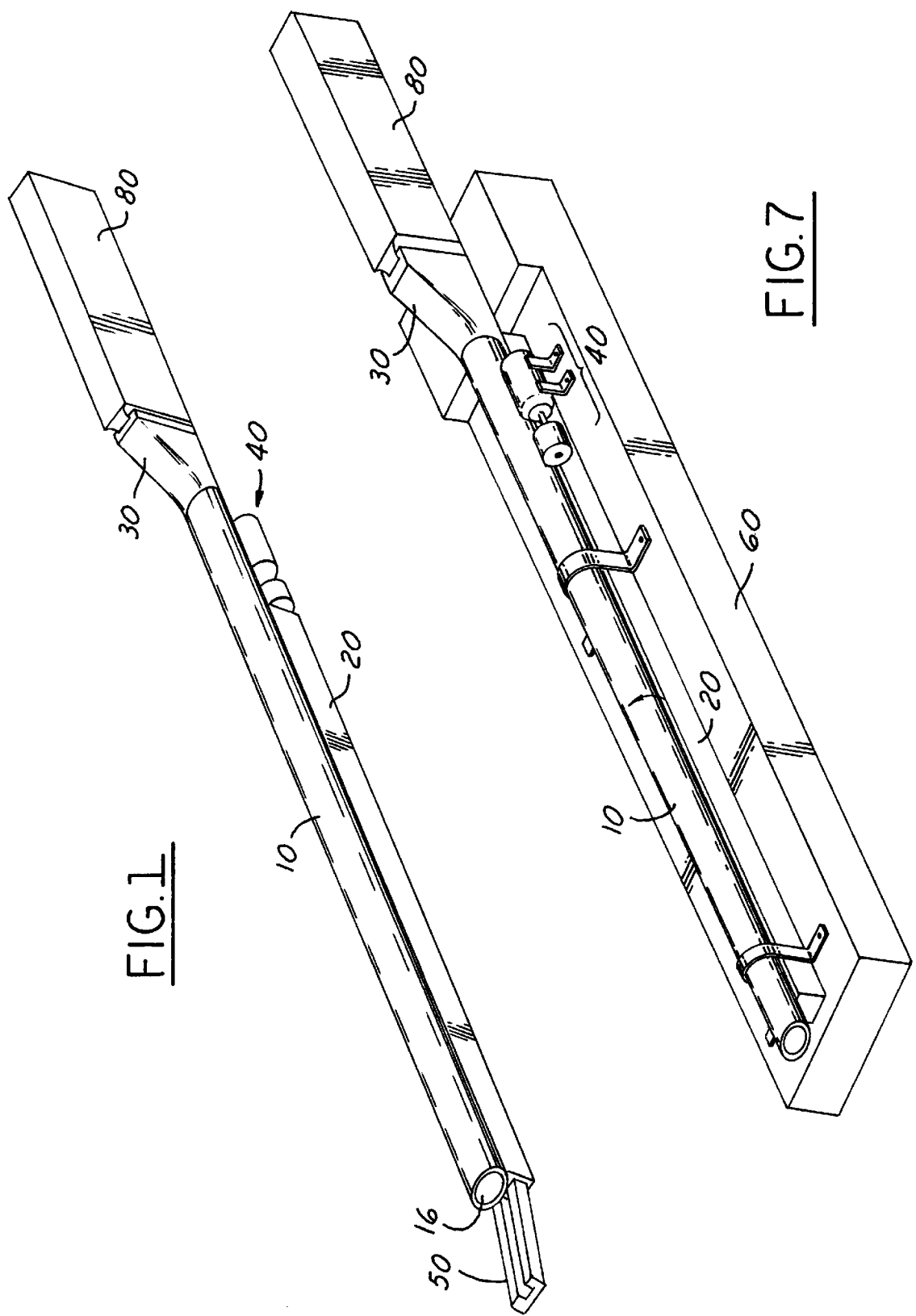

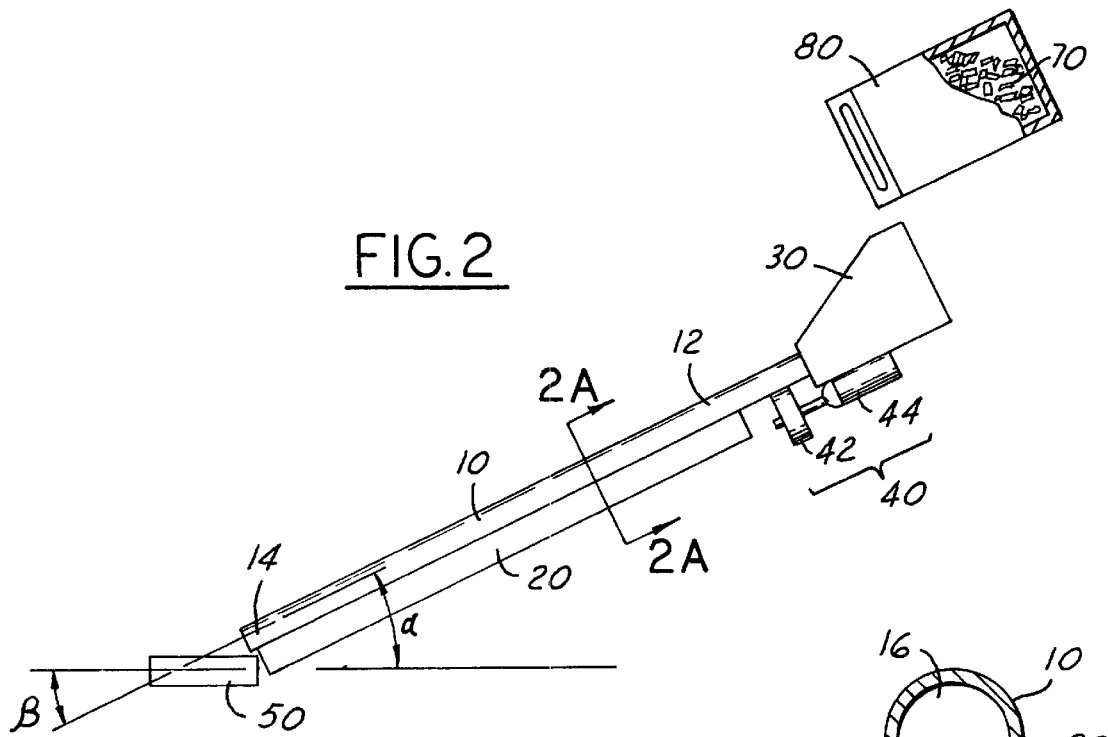
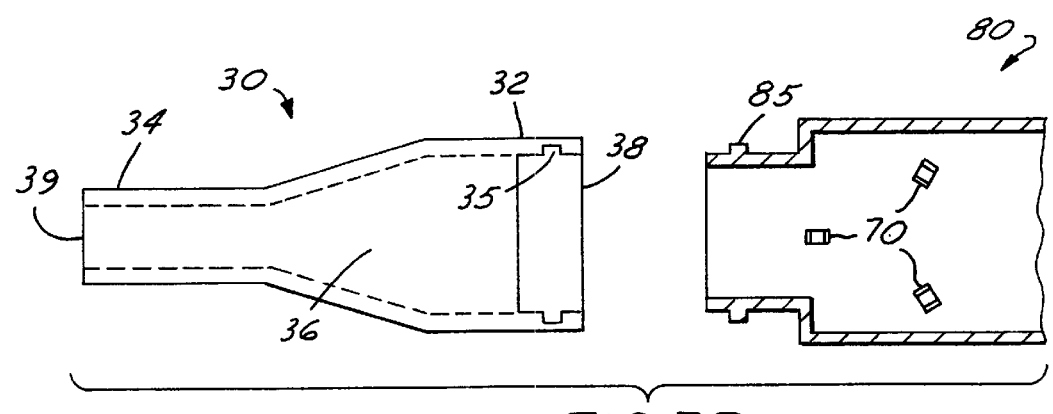

6,152,281

MAGNETIC BULK FEEDER FOR ELECTRONIC COMPONENTS

BACKGROUND OF THE INVENTION

1. Field of the Invention

The present invention relates generally to a bulk feeder apparatus, and more particularly to a bulk feeder apparatus for electronic chip components.

2. Disclosure Information

In the manufacture of circuit boards, it is common practice to use automated pick-and-place machines to positions electronic components on the circuit board prior to soldering. It is also common practice to supply the components to the pick-and-place machine in either of two ways: (1) on reel-to-reel strips, or (2) in bulk feeders, such as hoppers, bowl feeders, and cassettes/cartridges.

Bulk feeding has certain advantages over reel-to-reel feeding. For example, loose (bulk) components are cheaper on a piece-part basis than reel-fed components, because the expense of attaching the components to the reel strips is avoided. Also, with bulk feeding no strip waste is left over after the components are used up.

However, with bulk feeding the components need to be oriented in an orderly way before presentment to the pick-and-place manipulator. A typical approach for accomplishing this is described in U.S. Pat. No. 4,846,345 to Hamuro et al. (incorporated herein by reference), wherein the loose components 108 are provided in a bulk feed cassette 101. As shown in FIGS. 1–3 of Hamuro et al., the cassette 101 is inserted into a hopper 102 which has a storage space 117 therein for receiving components 108 from the upwardly-inclined cassette 101. The components 108 gravitate toward the lowest region within the hopper storage space 117 and may slide one-by-one through a downwardly-inclined passage 118 whose dimensions permit only one component at a time to pass therethrough. The components 108 then may slide down a tube 141 and onto a positioning stand 142 for presentation to the pick-and-place machine, as illustrated in FIGS. 5 and 6 of Hamuro et al.

To prevent the components 108 from clogging up the entry to the passage 118, an upwardly-pointing blowing passage 140 is defined in the floor of the component passage 118 adjacent the top entry point thereof, as shown in FIG. 5 of Hamuro et al. A blast of air or other gas is intermittently blown through this passage 140 to dislodge any components 108 which might be blocking the entry to the component passage 118.

However, the air blast sometimes causes damage to the components as they are blown around in the hopper. It would be desirable, therefore, to provide an alternative way of bulk feeding electronic components which avoids the air blast of the foregoing approach.

SUMMARY OF THE INVENTION

The present invention overcomes the disadvantages of the prior art approaches by providing an apparatus for bulk-feeding electronic components which utilizes magnetic force and a rotating feeder tube to properly orient the components for presentment to an automated pick-and-place machine. The apparatus comprises: (1) a generally straight tube having a raised end, a lowered end, a longitudinal axis, and a generally cylindrical interior passage therethrough; (2) a generally straight bar magnet arranged beneath and proximate the tube, wherein the bar magnet has a North pole-South pole axis oriented generally parallel with the tube longitudinal axis; (3) a receptacle having first and second ends and a tapered throat running therethrough, wherein the throat extends from an enlarged inlet defined in the first end to a constricted outlet defined in the second end, the receptacle being disposed such that the inlet is elevated above the outlet, the second end of the receptacle being disposed in rotatably slidable contact with the raised end of the tube such that the constricted outlet is placed in communication with the tube interior passage thereat; and (4) means for rotating the tube about its longitudinal axis.

It is an object and advantage that the present invention uses magnetic force and a rotating feeder tube to properly orient electronic chip components for presentment of the components to an automated pick-and-place machine.

Another advantage is that the present invention is relatively simple to manufacture and is compatible with various types of existing bulk feed machines and systems, such as bulk feed component cassettes, bowl feeders, hoppers, and the like.

These and other advantages, features and objects of the invention will become apparent from the drawings, detailed description and claims which follow.

BRIEF DESCRIPTION OF THE DRAWINGS

FIGS. 1–2 are perspective and side views, respectively, of a bulk feed apparatus according to the present invention.

FIG. 2A is a sectional view of the tube and magnet taken along line 2A—2A in FIG. 1.

FIGS. 3A–B are sectional top and sectional side views, respectively, of a receptacle portion of the present invention.

FIG. 7 is a side view of the present invention including a support structure therefor.

DETAILED DESCRIPTION OF THE PREFERRED EMBODIMENTS

Figure 4A:
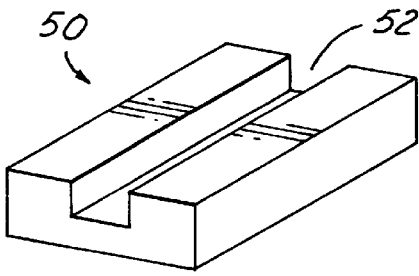
FIGS. 4A–C are perspective views of alternative versions of a staging platform of the present invention.

Referring now to the drawings, FIGS. 1–2 show an apparatus for bulk feeding electronic chip components 70 according to the present invention. The apparatus comprises: (1) a generally straight tube 10 having a raised end 12, a lowered end 14, a longitudinal axis L—L, and a generally cylindrical interior passage 16 therethrough; (2) a generally straight bar magnet 20 arranged beneath and proximate the tube 10, wherein the magnet has a North pole-South pole axis N-S oriented generally parallel with the tube longitudinal axis L—L; (3) a receptacle 30 having first and second ends 32/34 and a tapered throat 36 running therethrough, wherein the throat extends from an enlarged inlet 38 defined in the first end to a constricted outlet 39 defined in the second end, the receptacle 30 being disposed such that the inlet 38 is elevated above the outlet 39, the second end 34 of the receptacle being disposed in rotatably slidable contact with the raised end 12 of the tube such that the constricted outlet 39 is placed in communication with the tube interior passage 16 thereat; and (4) means 40 for rotating the tube 10 about its longitudinal axis L—L.

To assist the reader in understanding the present invention, all reference numbers used herein are summarized in the table below, along with the elements they represent:

10=Tube
12=Raised end of tube
14=Lowered end of tube
16=Interior passage through tube
20=Bar magnet
22=Longitudinal trough on top of bar magnet
30=Receptacle
32=First end of receptacle
34=Second end of receptacle
35=Slot in receptacle for receiving cassette
36=Tapered throat of receptacle
37=Opening at top of receptacle first end
38=Enlarged inlet in first end of receptacle
39=Constricted outlet in second end of receptacle
40=Means for rotating tube
42=Driving wheel
44=Motor
50=Staging platform
52=Channel in top surface of staging platform
54=Upstream end of channel
56=Downstream end of channel
57=Stop at downstream end of channel
58=Pocket formed about downstream end
60=Support structure
70=Electronic chip components
80=Bulk feed component cassette
85=Ridge on cassette for attachment to receptacle
α=Angle between tube axis and the horizontal
β=Angle between channel and tube axes
A—A=Longitudinal axis of component
L—L=Longitudinal axis of tube
N-S=North pole-South pole axis of bar magnet The feeder tube 10 may be made from a wide variety of materials, but is preferably is made of transparent plastic so that human operators may see into and monitor the tube during operation of the apparatus. The construction material for the tube should be selected such that the coefficients of static and dynamic friction of the interior surface of the tube passage are small enough to assure that the components 70 remain orderly in line within the tube without excessively tumbling about. The exterior surface of the tube is preferably circular in transverse cross-section, but it may alternatively assume other shapes (e.g., square, hexagonal, etc.). The interior surface of the tube should be circular in cross-section (i.e., the passage 16 through the tube should be cylindrical) in order to minimize tumbling of the components therein. Alternatively, the passage 16 may be designed to taper from a larger diameter at the raised end 12 of the tube to a smaller diameter at the lowered end.

The tube 10 is preferably disposed such that it may rotate about its longitudinal axis L—L, and such that one end (i.e., the raised end 12) is held higher than the other (i.e., the lowered end 14). The angle of inclination α of the tube with respect to the horizontal is preferably between 0 and 45 degrees, with 30 degrees being most preferred.

The bar magnet 20 may be a permanent magnet or an electromagnet, and should be arranged beneath, generally parallel with, and proximate (i.e., almost touching, or actually touching) the tube 10. The magnet 20 should be oriented such that its North-South polar axis N-S is generally parallel with the tube's longitudinal axis L—L. This orientation of the magnetic field, in conjunction with the rotation and inclination of the tube 10, causes the electronic components 70 within the tube to orient with their longitudinal axes A—A aligned generally parallel with the magnet axis N-S as the components march down the tube. The bar magnet 20 should extend along at least 80% of the full length of the tube, and should preferably extend the full length of the tube. The bar 20 may comprise a single magnet, or may comprise a plurality of magnets all oriented with their respective axes N-S aligned generally parallel with the tube axis L—L. Optionally, each magnet 20 may have a longitudinal trough 22 defined in the top surface thereof, within which the tube may rest and rotate, as illustrated in FIG. 2A.

Figure 6A:
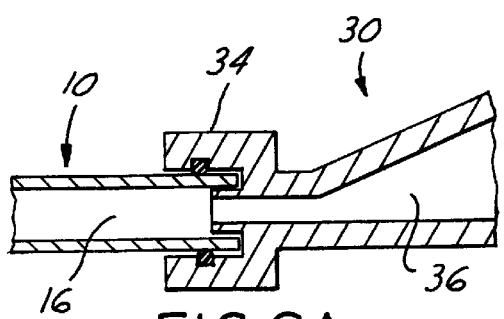
FIGS. 6A–B are sectional side views of mating arrangements between the tube and receptacle of the present invention.
Figure 6B:
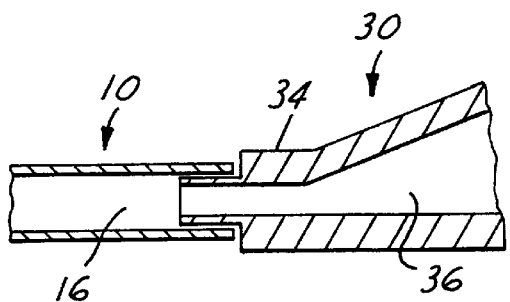

The receptacle 30 has first and second ends 32/34 and a tapered throat 36 therethrough, as illustrated in FIGS. 3A–B. The throat 36 extends from an enlarged inlet 38 defined in the first end 32 to a constricted outlet 39 defined in the second end, with the inlet 38 being disposed higher than the outlet 39. The first end 32 and/or the enlarged inlet 38 may be designed so as to be removably fastenable to an electronic component bulk feed cassette 80, such as the chip component cassettes produced by MURATA ELECTRONICS and described in Hamuro et al., as illustrated in FIGS. 6A–B, or may be designed to be removably fastenable to the exit end of a bulk feed hopper (not shown). For example, as shown in FIGS. 3A–B, the receptacle 30 may have vertical slots 35 formed on the interior walls of the first end 32 adjacent the inlet 38 which match up with corresponding vertical ridges 85 formed on the outside of the cassette adjacent the opening or door of the cassette. With this arrangement, the opening- or door-end of the cassette 80 may be slid down into the receptacle 30 through the hole 37 in the top thereof adjacent the inlet 38, such that the cassette ridges 85 are seated in their corresponding receptacle slots 35. Alternatively, the receptacle 30 may be designed large enough to serve as a component hopper itself, without the need to connect an external cassette 80 or hopper thereto. The funnel-like tapering of the throat 36 and the placement of the component inlet 38 above the outlet 39 assures a ready flow of components 70 through the receptacle 30.

The second end 36 of the receptacle should be disposed in rotatably slidable contact with the raised end 12 of the tube 10, such that the receptacle outlet 39 is placed in generally sealable communication with the interior passage 16 of the tube at the raised end 12. This permits the components 70 to pass from the receptacle outlet 39 to the raised end 12 of the feeder tube 10 without spilling or jamming the components.

The means 40 for rotating the tube about its longitudinal axis L—L may comprise a driving wheel 42 attached to a motor 44, as illustrated in FIGS. 1–2. The driving wheel 42 may be placed in frictionally engageable contact with the tube outer surface so as to cause the tube to rotate about its axis L—L. Alternatively, the rotating means 40 may include belt drives, gear drives, windmill-like fluid-and-vane drives, or any other known means for rotating the tube about its axis.

The tube 10 may be constrained so as to limit its movement to only rotation about its axis (without appreciable translation/motion along its axis) by disposing the tube within a longitudinal trough 22 in the magnet 20, as described above, and/or by providing guides, thrust bearings, circumferential bearings, or the like about the tube to constrain its motion. For example, the raised end 12 of the tube 10 may be rotatably attached to the second end/constricted outlet 34/39 of the receptacle 30; this attachment would allow rotation of the tube about its axis L—L, but would constrain the raised end 12 from any other translational movement or displacement.

The apparatus may further include a staging platform 50, such as illustrated in FIGS. 1–2, 4A–C, and 5A–C. This platform 50 receives properly aligned components 70 from the feeder tube 10 and provides a staging area for the components, so that an automated pick-and-place unit (not shown) may pick up a component 70 for placement on a circuit board. The platform 50 preferably includes a generally straight, short channel or groove 52 defined in the top surface thereof, wherein the channel 52 has an "upstream" end 54 and a "downstream" end 56. The channel 52 may be cut across the entire surface of the platform 50 from one end/edge of the platform to the other as in FIG. 4A, or may extend out to only one end of the platform as in FIGS. 4B and 5A–C, or may not extend out to either end as in FIG. 4C. In either case, the staging platform 50 should be disposed such that the upstream end 54 of the channel 52 is presented proximate and beneath the exit end 14 of the tube. This allows each component 70 exiting the tube 10 to drop or slide into the channel 52, and to then be pushed by the next component 70 along the channel.

The platform 50 is preferably disposed such that the channel longitudinal axis lies within the same vertical plane as the tube longitudinal axis L—L. Because the tube is inclined at an angle α with respect to the horizontal, the platform 50 may be tilted upwards from the longitudinal axis L—L by an angle β generally equivalent to α, so that the channel 52 is disposed in a generally level orientation with respect to the horizontal.

Figure 4B:
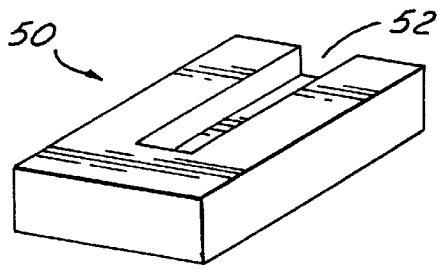
Figure 4C:
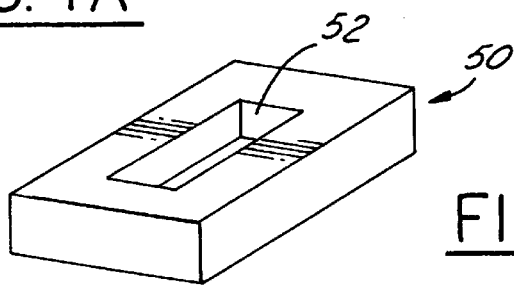
Figure 5A:
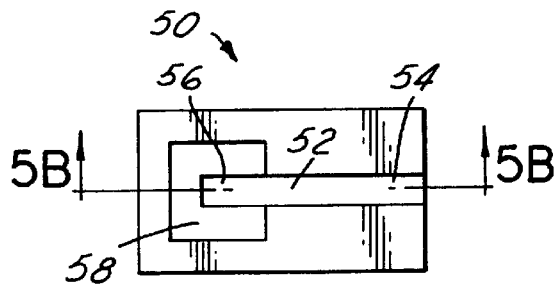
FIGS. 5A–C are top, sectional side, and perspective views, respectively, of a staging platform of the present invention having an additional pocket formed therein.
Figure 5B:
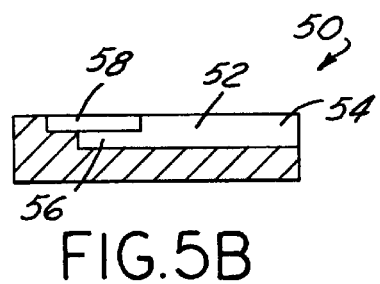
Figure 5C:
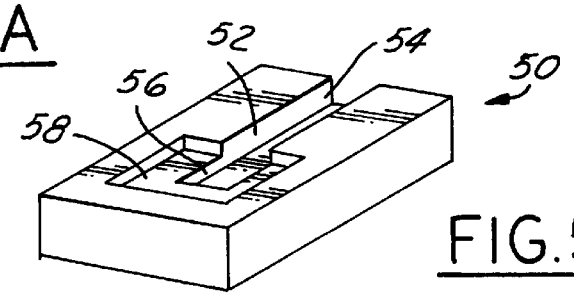

If a platform configuration similar to FIG. 4B or 4C is used, a stop 57 is inherently provided at the downstream end 56 of the channel, against which the leading component abuts, thereby stopping the flow of further components into the channel. When a pick-and-place machine picks up the leading component 70 on the staging platform 50, the remaining lined-up components advance (due to the rotation and inclination of the tube), presenting the next-in-line component as the new leading component. To assist in component pick-up by the pick-and-place machine, a pocket 58 may be formed about the downstream end 56 of the channel, as illustrated in FIGS. 5A–C. This pocket 58 provides additional clearance around the leading component position, allowing the pick-and-place manipulator to more easily grab the component 70. The pocket 58 should be cut to a depth less than that of the channel.

The apparatus may further comprise a generally rigid support structure 60 for supporting the bar magnet 20, the means 40 for rotating, and the receptacle 30, as illustrated in FIG. 7. The structure 60 may further include bearings, guides, and/or other features for constraining the tube motion to rotation only, as well as support for a staging platform 50 and/or a component cassette 80 or bulk feed hopper.

The present invention may be used to bulk feed a wide variety of electronic chip components, such as chip resistors and chip capacitors. The length and interior diameter of the tube, the rotational speed of the tube, and other process parameters may easily be determined by those having skill in the art to which the present invention pertains, based on such factors as: the dimensions of the components 70, the component feed rate needed to accommodate the speed at which the pick-and-place machine operates, etc. For most common chip components, a recommended starting point is a tube length of 12–24 inches, an interior passage diameter of 3–5 times the width of the components 70, and a rotational speed of 30–60 RPM.

Various other modifications to the present invention may occur to those skilled in the art to which the present invention pertains. It is the following claims, including all equivalents, which define the scope of the present invention.

What is claimed is:

1. An apparatus for bulk-feeding electronic components, comprising:
   a generally straight tube having a raised end, a lowered end, a longitudinal axis, and a generally cylindrical interior passage therethrough;
   a generally straight bar magnet arranged beneath and proximate said tube, wherein said bar magnet has a North pole-South pole axis oriented generally parallel with said longitudinal axis;
   a receptacle having first and second ends and a tapered throat running therethrough, wherein the throat extends from an enlarged inlet defined in said first end to a constricted outlet defined in said second end, said receptacle being disposed such that said enlarged inlet is elevated above said constricted outlet, said second end of said receptacle being disposed in rotatably slidable contact with said raised end of said tube such that said constricted outlet is placed in generally sealable communication with said interior passage thereat; and
   means for rotating said tube about said longitudinal axis.

2. An apparatus according to claim 1, wherein said tube is made of transparent plastic.

3. An apparatus according to claim 1, wherein said interior passage tapers from a larger diameter at said raised end to a smaller diameter at said lowered end.

4. An apparatus according to claim 1, wherein said bar magnet extends generally along at least 80% of the length of said tube.

5. An apparatus according to claim 1, wherein said means for rotating includes a driving wheel affixed to a motor, wherein said driving wheel is disposed in frictionally engageable contact with the outer surface of said tube.

6. An apparatus according to claim 1, wherein said tube rests atop said bar magnet.

7. An apparatus according to claim 1, wherein said bar magnet has a longitudinal trough along the top surface thereof within which said tube may rotate.

8. An apparatus according to claim 1, wherein said raised end of said tube is rotatably attached to said second end of said receptacle.

9. An apparatus according to claim 1, wherein said first end and mouth of said receptacle are adapted for receiving an electronic component bulk feed cassette thereat.

10. An apparatus according to claim 1, wherein said first end and enlarged inlet of said receptacle are adapted for receiving the exit end of a hopper thereat.

11. An apparatus according to claim 1, further comprising a staging platform having a generally straight channel defined in a top surface thereof, wherein the channel has upstream and downstream ends thereof, said staging platform being disposed with said upstream end of the channel presented proximate and generally beneath said lowered end of said tube.

12. An apparatus according to claim 11, wherein said channel is tilted upwards from the longitudinal axis of said tube generally between 0 and 30 degrees.

13. An apparatus according to claim 12, wherein said staging platform is disposed in a generally level orientation.

14. An apparatus according to claim 1, further comprising a generally rigid support structure for supporting said bar magnet, said means for rotating, and said receptacle.

15. An apparatus for bulk-feeding electronic components, comprising:

a generally straight tube having a raised end, a lowered end, a longitudinal axis, and a generally cylindrical interior passage therethrough;

a generally straight bar magnet arranged beneath and proximate said tube, wherein said bar magnet has a North pole-South pole axis oriented generally parallel with said longitudinal axis;

a receptacle having first and second ends and a tapered throat running therethrough, wherein the throat extends from an enlarged inlet defined in said first end to a constricted outlet defined in said second end, said receptacle being disposed such that said enlarged inlet is elevated above said constricted outlet, said first end and said enlarged inlet being adapted for receiving an electronic component bulk feed cassette thereat, said second end of said receptacle being disposed in rotatably slidable contact with said raised end of said tube such that said constricted outlet is placed in generally sealable communication with said interior passage thereat; and means for rotating said tube about said longitudinal axis.

16. An apparatus according to claim 15, further comprising a staging platform having a generally straight channel defined in a top surface thereof, wherein the channel has upstream and downstream ends thereof, said staging platform being disposed with said upstream end of the channel presented proximate and generally beneath said lowered end of said tube.

17. An apparatus according to claim 16, wherein said downstream end of the channel is tilted upwards from the longitudinal axis of said tube generally between 0 and 30 degrees, such that said staging platform is disposed in a generally level orientation.

18. An apparatus for bulk-feeding electronic components, comprising:

a generally straight tube having a raised end, a lowered end, a longitudinal axis, and a generally cylindrical interior passage therethrough;

a generally straight bar magnet arranged beneath and proximate said tube, wherein said bar magnet has a North pole-South pole axis oriented generally parallel with said longitudinal axis;

a receptacle having first and second ends and a tapered throat running therethrough, wherein the throat extends from an enlarged inlet defined in said first end to a constricted outlet defined in said second end, said receptacle being disposed such that said enlarged inlet is elevated above said constricted outlet, said second end of said receptacle being disposed in rotatably slidable contact with said raised end of said tube such that said constricted outlet is placed in generally sealable communication with said interior passage thereat;

means for rotating said tube about said longitudinal axis; and a staging platform having a generally straight channel defined in a top surface thereof, wherein the channel has upstream and downstream ends thereof, said staging platform being disposed with said upstream end of the channel presented proximate and generally beneath said lowered end of said tube.

19. An apparatus according to claim 18, wherein said downstream end of the channel is tilted upwards from the longitudinal axis of said tube generally between 0 and 30 degrees, such that said staging platform is disposed in a generally level orientation.

20. An apparatus according to claim 18, wherein said first end and enlarged inlet of said receptacle are adapted for receiving an electronic component bulk feed cassette thereat.

* * * * *